(12) United States Patent
Tsai et al.

(10) Patent No.: US 11,145,521 B2
(45) Date of Patent: Oct. 12, 2021

(54) METHOD FOR CLEANING A SEMICONDUCTOR SUBSTRATE

(71) Applicant: TAIWAN SEMICONDUCTOR MANUFACTURING CO., LTD., Hsinchu (TW)

(72) Inventors: Mei Hui Tsai, Hsin-Chu (TW); Hsiao-Yi Wang, Zhunan Township (TW); Yen-Min Liao, Miaoli (TW); Po-Sheng Lu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 157 days.

(21) Appl. No.: 15/718,044

(22) Filed: Sep. 28, 2017

(65) Prior Publication Data
US 2019/0096707 A1 Mar. 28, 2019

(51) Int. Cl.
| | |
|---|---|
| *B08B 3/04* | (2006.01) |
| *B08B 3/10* | (2006.01) |
| *H01L 21/67* | (2006.01) |
| *H01L 23/60* | (2006.01) |

(52) U.S. Cl.
CPC .......... *H01L 21/67057* (2013.01); *B08B 3/04* (2013.01); *H01L 21/67051* (2013.01); *H01L 21/67253* (2013.01); *B08B 3/10* (2013.01); *H01L 23/60* (2013.01)

(58) Field of Classification Search
None
See application file for complete search history.

(56) References Cited

U.S. PATENT DOCUMENTS

| | | | |
|---|---|---|---|
| 5,635,053 A * | 6/1997 | Aoki | ................. H01L 21/02052 205/746 |
| 6,468,362 B1* | 10/2002 | Chen | ......................... B08B 1/04 134/17 |
| 2003/0013310 A1 | 1/2003 | Tomimori | |
| 2006/0054181 A1* | 3/2006 | Rayandayan | ............ C11D 3/32 134/1 |
| 2008/0173335 A1* | 7/2008 | Yoon | ................. H01L 21/68728 134/62 |
| 2009/0090395 A1 | 4/2009 | Chen | |

(Continued)

FOREIGN PATENT DOCUMENTS

TW 201725619 A 7/2017

*Primary Examiner* — Nicole Blan
(74) *Attorney, Agent, or Firm* — Duane Morris LLP

(57) ABSTRACT

A method for cleaning a semiconductor substrate is provided. The method includes the steps of: applying a first agent onto a top surface of the semiconductor substrate while the semiconductor substrate is rotated at a first rotational frequency; immersing the semiconductor substrate in a second agent while rotating the semiconductor substrate at a second rotational frequency; and rotating the semiconductor substrate at a third rotational frequency while a third agent is introduced onto the top surface of the semiconductor substrate. The first rotational frequency may be greater than the third rotational frequency and the third rotational frequency is greater than the second rotational frequency. In some embodiments, the second rotational frequency is zero and the semiconductor substrate is held stationary during the immersing step.

15 Claims, 7 Drawing Sheets

(56) References Cited

U.S. PATENT DOCUMENTS

2014/0290701 A1\* 10/2014 Nagamine ................. B08B 3/04
　　　　　　　　　　　　　　　　　　　　　　134/26
2015/0040951 A1\* 2/2015 Yoshizumi ........ H01L 21/67051
　　　　　　　　　　　　　　　　　　　　　　134/26
2017/0207079 A1 7/2017 Lee \* cited by examiner

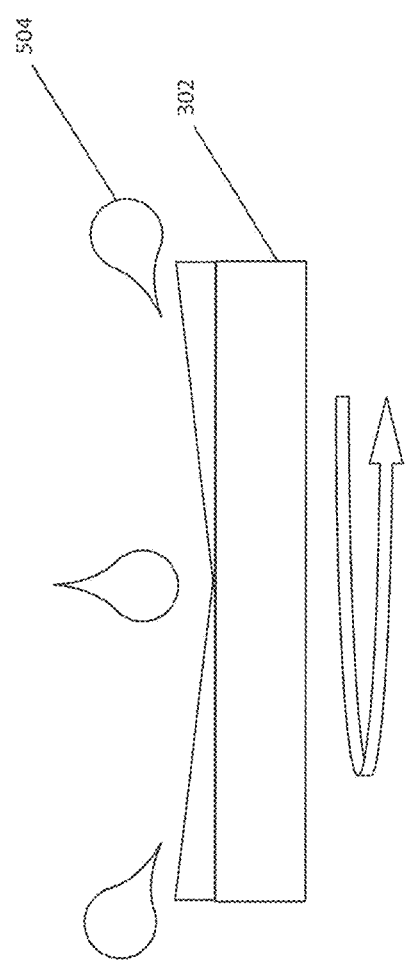

METHOD FOR CLEANING A SEMICONDUCTOR SUBSTRATE

BACKGROUND

This disclosure relates to semiconductor processing. More particularly, the disclosed subject matter relates to a method for cleaning a semiconductor substrate.

The surface of a semiconductor substrate such as a silicon substrate is cleaned before element layers are formed on the substrate. Cleaning the surface of semiconductor substrates is a critical step in the integrated circuit fabrication process. Surface cleaning eliminates particulates and trace surface contaminations such as organic and metallic impurities. These cleaning techniques have been based almost entirely on chemical reagents, which selectively remove the surface contaminants and particulates without attacking or chemically altering the wafer surface. As the permissible concentrations of contaminants scale down with increasing device integration density, the quality of a cleaning process becomes even more important. The cleaning methods include wet cleaning with a liquid medium and dry cleaning with vapor phase medium.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

FIG. 5 illustrates the semiconductor substrate of FIG. 4 rotated at a third rotational frequency while a third agent is introduced to the top surface of the semiconductor substrate (at step 206).

DETAILED DESCRIPTION

Figure 1:
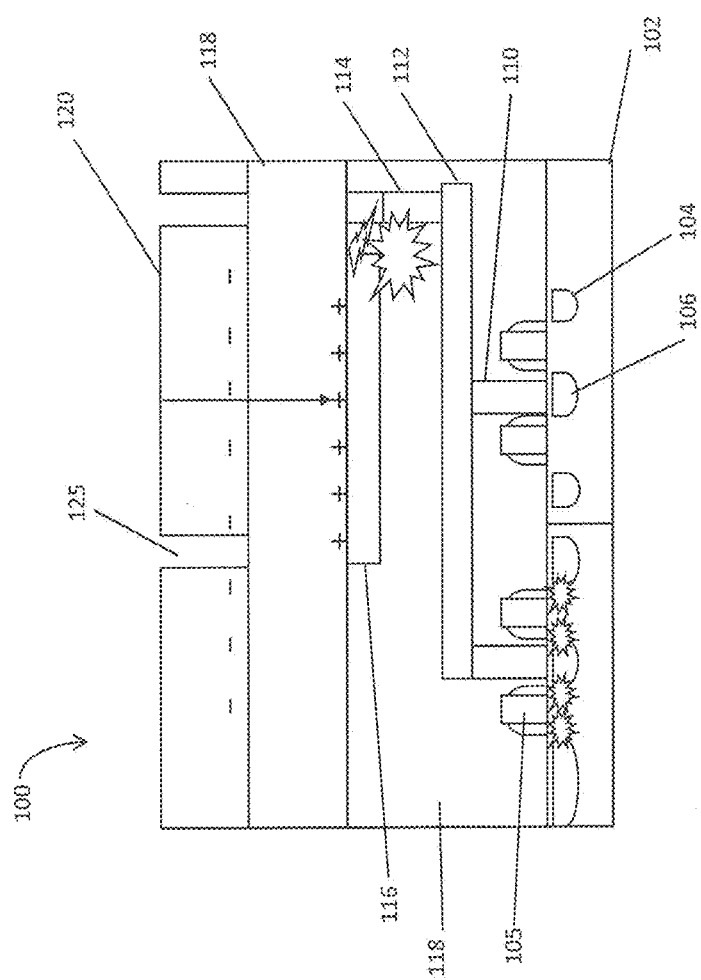
FIG. 1 is a cross-sectional view of a schematic representation of an integrated circuit showing the impact of damage by electrostatic charge accumulation.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a semiconductor substrate" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

In semiconductor processes such as lithography development processes, a semiconductor substrate such as a silicon wafer needs to be cleaned. In some embodiments, the semiconductor substrate undergoes a rinse using deionized (DI) water, in which the substrate is rotated at high speed. While this rinsing process removes byproducts or contaminations on the substrate, it often leads to an accumulation of an electrostatic charge within the substrate. This electrostatic charge can damage the components of the semiconductor or associated integrated circuit. In some other embodiments, an acid water is used in place of the deionized water. While the use of acid water may reduce the electrostatic charge, costs are increased and safety is compromised due to the nature of the agent. Thus, there is a need for a process for cleaning a semiconductor substrate to reduce or eliminate electrostatic charge, without increasing costs or compromising safety.

The present disclosure provides methods of cleaning a semiconductor substrate in semiconductor processes, for example, during or after a lithography development process. The methods disclosed herein reduce the electrostatic charge within the substrate, thereby improving the effectiveness of the semiconductor substrate and the resulting integrated circuit. Both particular contaminations on a semiconductor substrate and damages from static charges are reduced or eliminated. Thus, the methods described herein provide a high yield of semiconductor devices from a semiconductor substrate.

Unless expressly indicated otherwise, reference to an "agent" or a "medium" made herein will be understood to encompass a chemical composition comprising a compound or a mixture for washing or cleaning a semiconductor device. The agent or medium are also referred as a cleaning agent or medium, a solvent, or a solution. In some embodiments, the agent or medium comprises deionized or pure water, or water comprising an additive or an aqueous solution comprising a small amount (e.g., less than 5 wt. %) of an additive such as an alcohol.

Unless expressly indicated otherwise, reference to a "rotational frequency" made herein will be understood to encompass a speed at a semiconductor substrate on a substrate holder is rotated (or spins). The rotational frequency or speed can be zero or an above-zero value in a suitable unit such as revolutions per minute. When the rotational frequency or speed is zero revolution per minute, the semiconductor substrate is stationary.

During the fabrication of integrated circuits, a variety of physical and chemical processes are performed on a semiconductor substrate. One of those processes, lithography, involves the formation of three-dimensional geometry on the substrate. This allows for the isolation and connection of transistors and other components to form the sophisticated circuitry of an integrated circuit. The lithography process often involves the use of a photoresist. This photoresist is applied to the substrate or a dielectric material in a thin layer. The photoresist, such as a light sensitive polymer, is exposed to a relief image, thereby causing a portion of the substrate or dielectric to be covered by the photoresist while other portions are uncovered. The covered portions of the substrate are protected from etching, ion implantation, or other pattern transfer mechanisms.

One step in the lithography process requires the development of the photoresist in order to pattern a dielectric layer. During this development process, a developer is applied to the photoresist in order to form the desired profile on the substrate. After development, the substrate, photoresist, and dielectric must be cleaned to remove particulates and other defects. The method for cleaning the semiconductor substrate described herein dissipates the electrostatic charge within the substrate while also achieving a low defect count. In some embodiments, the method includes rinsing the substrate using deionized (DI) water while the substrate is rotated at high speed. After the high speed rinse, the substrate is exposed to or immersed into a bath of DI water while the substrate is stationary. Finally, the substrate undergoes a low-speed rinse using DI water.

FIG. 1 is a schematic view illustrating the damage that electrostatic charge can cause to an exemplary semiconductor device 100 including integrated circuits disposed on a semiconductor substrate 102. Semiconductor device 100 may include transistors disposed on the semiconductor substrate 102 and the transistors may be defined by a plurality of source/drain regions 104, 106, and one or more gate electrodes 105. Metal interconnects 112, 114, 116 are coupled to the semiconductor substrate 102 by a conductive material 110. An interlayer dielectric 118 is in contact with or is disposed over a plurality of metal interconnects 112, 114, 116. Referring to FIG. 1, during an exemplary lithography process, a photoresist 120 is disposed on an interlayer dielectric 118. The photoresist 120 may be patterned to define trenches 125 for further processes.

In some embodiments, when the semiconductor substrate 102 is cleaned, for example, with deionized water, and then dried, static charges buildup on the insulating materials such as the photoresist 120 and interlayer dielectric 118. Highly pure water without any ions or electrolytes can cause static charges buildup. These charges can travel along the metal interconnects 112, 114, 116, and damage the sensitive device features such as transistors. This damage negatively impacts the efficacy of the integrated circuit, and decreases the overall yield of semiconductor devices.

Figure 2:
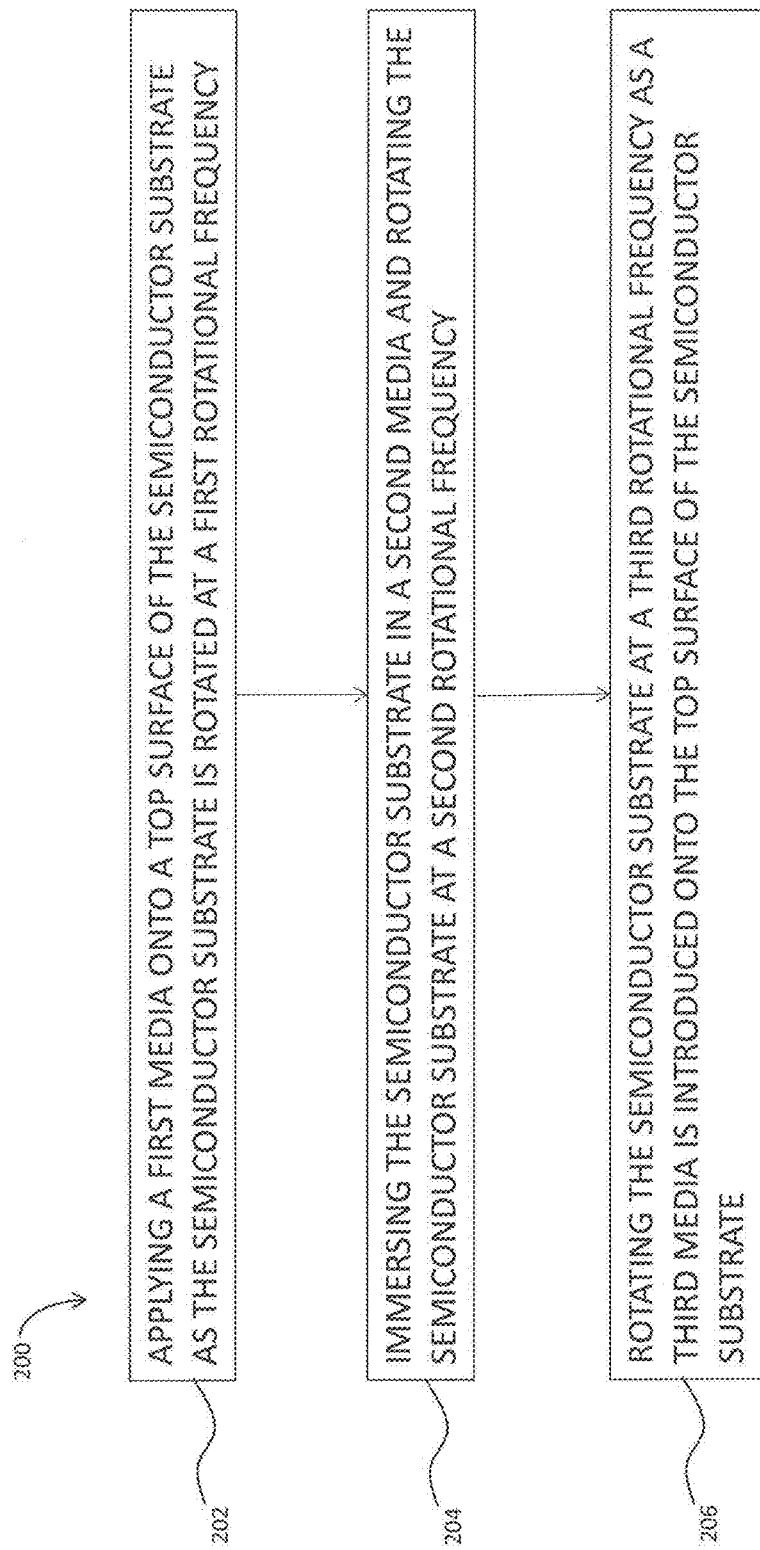
FIG. 2 is a flow-chart depicting an exemplary method for cleaning a semiconductor substrate including steps 202, 204 and 206 in accordance with some embodiments.
Figure 3:
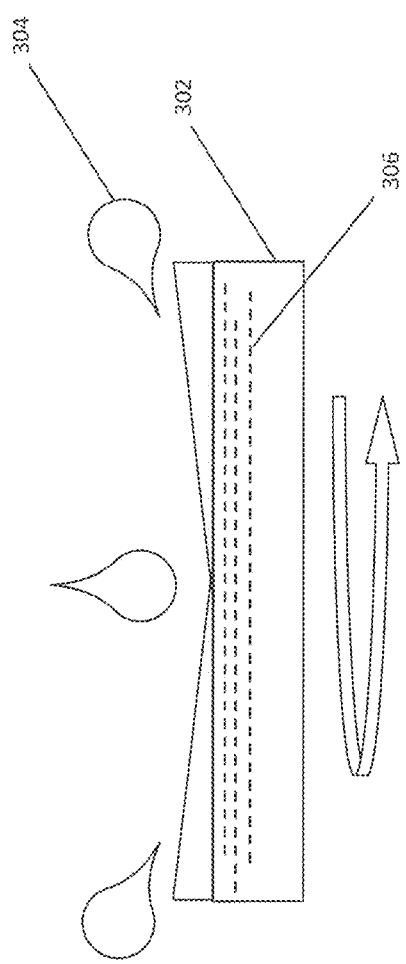
FIG. 3 is a cross-sectional view illustrating a semiconductor substrate rotated at a first rotational frequency while a first agent is applied onto the top surface of the semiconductor substrate (at step 202).

Referring to FIG. 2, an exemplary method 200 for cleaning a semiconductor substrate while reducing the buildup of electrostatic charge is provided in accordance with some embodiments. The exemplary method 200 may be performed in an environment, in which the temperature is near room temperature or about 23 degrees Celsius to about 25 degrees Celsius.

At step 202, a first agent 304 is applied onto a top surface of the semiconductor substrate 302 while rotating the semiconductor substrate 302 at a first rotational frequency (or speed). The semiconductor substrate 302 can be a silicon wafer or any other suitable substrate. Substrate 302 can be of any appropriate size and shape. In some embodiments, substrate 302 is substantially circular with a diameter of about 200 mm. Substrate 302 may include the exemplary semiconductor device 100 and related structural features as described. The first agent 304 is a fluid or liquid medium. Examples of a suitable first agent is deionized or pure water, or water comprising a small amount of additives such as a volatile alcohol. The first rotational frequency (or speed) is equal to or higher than 900 or 1,000 rpm, for example, in a range of from about 1,000 to 2,000 rpm.

The first agent 304 may be applied using a nozzle or other means. As the first agent 304 is applied to the substrate 302, the rotation of the substrate 302, and the associated centrifugal force, causes at least a portion of the first agent 304 to be expelled from the surface. Step 202 can remove particulates and defects present on the surface. In some embodiments, the first agent 304 is DI water. Advantageously, DI water is safe to handle and relatively inexpensive, allowing the cost of processing to be reduced. Alternatively, the first agent 304 may be any other suitable fluid. An electrostatic charge 306, illustrated as dashed lines, may accumulate in the semiconductor substrate 302.

Figure 4:
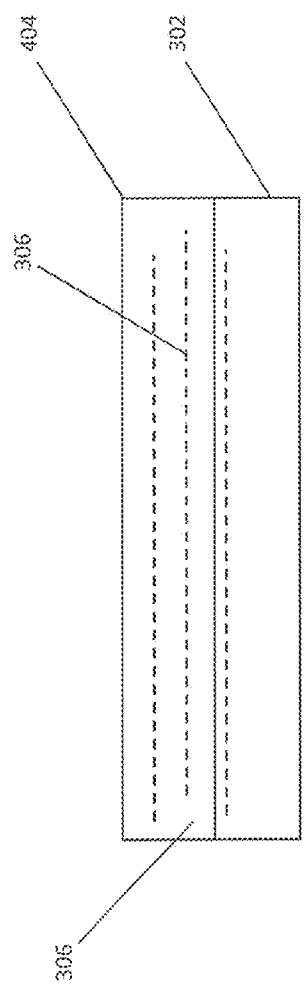
FIG. 4 illustrates the semiconductor substrate of FIG. 2 immersed in a second agent (at step 204).

At step 204 of FIG. 2, the semiconductor substrate 302 is immersed in a second agent 404 while the substrate 302 is rotated at a second rotational frequency (or speed). The second agent 404 and the semiconductor substrate 302 may be placed inside a container (not shown). This process is illustrated in FIG. 4. In a preferred embodiment, the second rotational frequency is zero and the substrate 302 is held stationary at step 204. Alternatively, the substrate 302 may be rotated at a low speed, for example, in a range from about 0.1 rpm to about 20 rpm (e.g., about 5 rpm or 10 rpm). By immersing the substrate 302 in the second agent 404, the electrostatic charge 306, which has accumulated in the substrate 302, is able to dissipate through the second agent 404, as shown in FIG. 4. In some embodiments, the second agent 404 is also DI water. Alternatively, the second agent 404 may be any other suitable fluid, for example, an aqueous mixture comprising water and a small amount (e.g., less than 5 wt. %, 2 wt. % or 1 wt. %) of an additive such as an alcohol. The second agent 404 may comprise a gas such as carbon dioxide. In some embodiments, the second agent 404 is a fluid with a resistivity of between about $1 \times 10^3$ ohm·meter and about $1 \times 10^6$ ohm·meter, for example, between about $5 \times 10^3$ ohm·meter and about $5 \times 10^5$ ohm·meter. In another preferred embodiment, the second agent 404 is a fluid with a resistivity of between about $1 \times 10^5$ ohm·meter and about $3 \times 10^5$ ohm·meter. In some embodiments, the second agent 404 is a fluid with a resistivity of about $1.8 \times 10^5$ ohm·meter. The second agent 404 may be deionized water. In some embodiments, the second agent 404 may be deionized water comprising carbon dioxide, having a resistivity of about $5 \times 10^3$ ohm·meter. By using an agent (or liquid medium) with a suitable resistivity, the electrostatic charge 306 may be dissipated through the second agent 404.

The substrate 302 may be immersed or maintained in the second agent 404 for any suitable duration of time, for example, in a range of from about 5 seconds to about 50 seconds, from about 5 seconds to about 30 seconds, or from about 8 seconds to about 10 seconds. In some embodiments, the substrate 302 is immersed in or dipped into the second agent 404 for a duration between about 8 seconds and about 10 seconds. In some embodiments, particulates 308 may diffuse through the second agent and be deposited on the substrate 302, as shown in FIG. 4.

Additionally, in at least some embodiments, subsequent to the immersion step 204, the semiconductor substrate 302 undergoes an additional rinsing at step 206. An exemplary step 206 is illustrated in FIG. 5. In step 206, a third agent (or medium) 504 is applied to the top surface of the substrate 302 while the substrate 302 is rotated. The third agent 504 may also be DI water. At step 206, the speed of rotation of the substrate 302 is lower than the speed of rotation at step 202; however, the centrifugal forces caused by the rotation is sufficient to cause a portion of the third agent 504 to be expelled from the surface. This lower speed minimizes the electrostatic charge 306 from accumulating on the substrate while removing a portion of the particulates 308 that diffused through the second agent 404 and were deposited on the substrate 302 at step 204. The inventors surprisingly found that rotating the substrate 302 at a rotational frequency in the range of about 300 revolutions per minute to about 600 revolutions per minute, in combination with step 204 with immersion, provides favorable results including minimal static charge and minimal particle contaminations.

Figure 6:
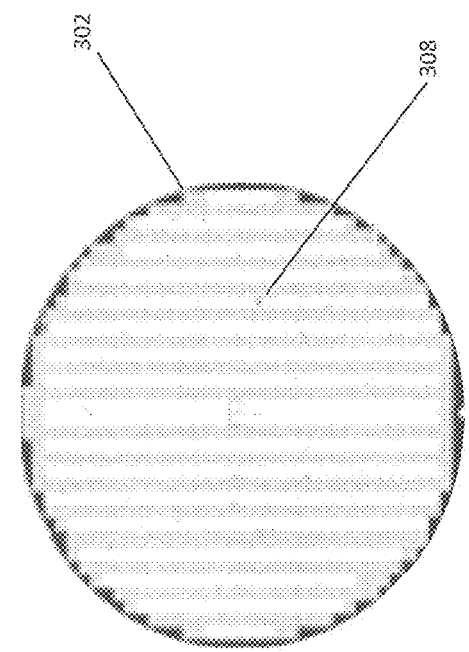
FIG. 6 is a defect map of a semiconductor substrate after the semiconductor substrate has undergone steps 202 and/or 206 without steps 204 (immersion step) in some embodiments.

Experiments were conducted to determine the effectiveness of the exemplary method 200 described herein. Referring to Table 1, in one experiment (Ex. 1), after steps 202 and step 206 without step 204, the defect count (a measure of the particulates on the surface) was 42 per wafer (as shown in FIG. 6) and the electric potential (a measure of the electrostatic charge) was −11.3 volts. The defect map measured is shown in FIG. 6, with the particulates 308 on substrate 302.

Figure 7:
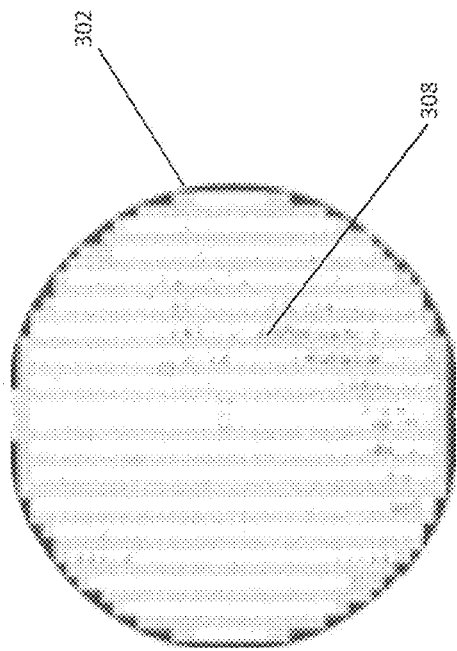
FIG. 7 is a defect map of a semiconductor substrate after the semiconductor substrate has undergone steps 202, 204 and 206, and step 206 is performed at 10 revolutions per minute in some embodiments.
Figure 9:
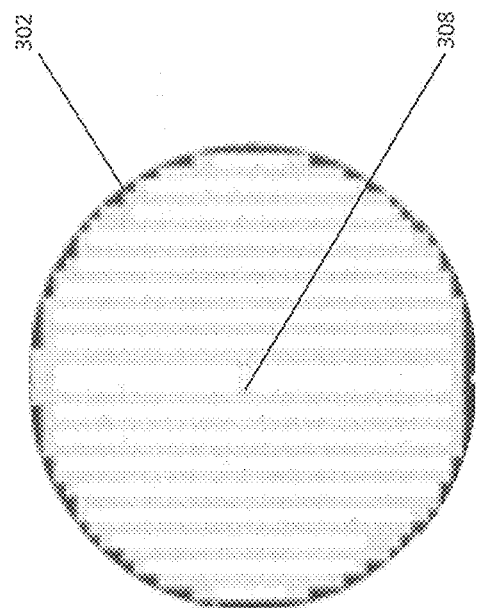
FIG. 9 is a defect map of a semiconductor substrate after the semiconductor substrate has undergone steps 202, 204 and 206, and step 206 is performed at 600 revolutions per minute in accordance with some embodiments.
Figure 8:
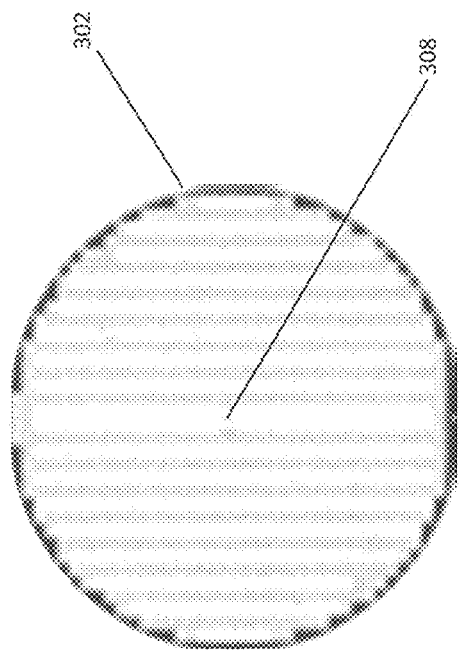
FIG. 8 is a defect map of a semiconductor substrate after the semiconductor substrate has undergone steps 202, 204 and 206, and step 206 is performed at 300 revolutions per minute in accordance with some embodiments.

In Examples 2-6 (Ex. 2-6), step 204 including stationary immersion in DI water was performed. The rotation speed in step 206 increases from Example 2 to Example 6. In Example 2, the rotation speed in step 206 is 10 rpm. The electric potential was reduced to −2.4 while the defect count was 317 per wafer. The defect map of Example 2 is shown in FIG. 7. As shown in Table 1, a rotational frequency at step 206 in the range of about 300 rpm to about 600 rpm (in Examples 3-4) provides the optimum results including both low particle contamination and low static charges. The defect maps measured after step 206 at a rotational frequency of 300 rpm (Example 5) and 600 rpm (Example 6) are shown in FIG. 8, and FIG. 9, respectively.

When the rotational frequency at step 206 continued to increase (in Examples 5-6), the electrostatic charge is again elevated, as shown in Table 1.

TABLE 1

| | Third rotational frequency (rpm) | Defect Count (particles per wafer) | Electric Potential (volts) |
| --- | --- | --- | --- |
| Ex. 1 (without step 204) | | 42 | −11.3 |
| Ex. 2 (with step 204) | 10 | 317 | −2.373 |
| Ex. 3 (with step 204) | 300 | 70 | −6.4 |
| Ex. 4 (with step 204) | 600 | 24 | −7.0 |
| Ex. 5 (with step 204) | 900 | Not measured | −8.1 |
| Ex. 6 (with step 204) | 1200 | Not measured | −9.8 |

The present disclosure provides a method for cleaning a semiconductor substrate. In some embodiments, an exemplary method described herein comprises the steps of: applying a first agent onto a top surface of the semiconductor substrate while rotating the semiconductor substrate at a first rotational frequency; immersing the semiconductor substrate in a second agent while rotating the semiconductor substrate at a second rotational frequency; and rotating the semiconductor substrate at a third rotational frequency while introducing a third agent is introduced onto the top surface of the semiconductor substrate. In some embodiments, the first rotational frequency is greater than the third rotational frequency and the third rotational frequency is greater than the second rotational frequency. The first agent, the second agent, and the third agent are different or the same. Each of the first, the second and the third agents is deionized water in some embodiments. In some embodiments, the second agent is a fluid with a resistivity of between about $1 \times 10^3$ ohm·meter and about $1 \times 10^6$ ohm·meter, for example, between about $5 \times 10^3$ ohm·meter and about $5 \times 10^5$ ohm·meter. The second agent may be a suitable liquid cleaning agent having a resistivity in a range of from about $1 \times 10^5$ ohm·meter ($\Omega \cdot m$) to about $3 \times 10^5$ $\Omega \cdot m$, for example, about $1.8 \times 10^5$ $\Omega \cdot m$. The second agent may be deionized water comprising carbon dioxide having resistivity of about $5 \times 10^3$ $\Omega \cdot m$. The first and the third agents are the same as the second agent having the same resistivity.

In some embodiments, the second rotational frequency is zero revolution per minute and the semiconductor substrate is stationary during the immersing step. The third rotational frequency is in a suitable range, for example, in a range of from about 200 revolutions per minute (rpm) to about 1,000 rpm, for example, from about 300 rpm to about 600 rpm, or from about 500 rpm to about 600 rpm.

In some embodiments, during the immersing step, the semiconductor substrate is immersed in the second agent for a suitable duration of time, for example, in a range of from about 5 seconds to about 50 seconds, from about 5 seconds to about 30 seconds, or from about 8 seconds to about 10 seconds.

Each of the steps of the exemplary method may be performed at a temperature in a range of from about 23 degrees Celsius to about 25 degrees Celsius.

Embodiments of the present disclosure also include a method including the steps of: applying a first agent to a top surface of the semiconductor substrate as the semiconductor substrate spins at a first rotational frequency; and immersing the semiconductor substrate in a second agent and rotating the semiconductor substrate at a second rotational frequency. In such embodiments, the second agent can have a resistivity in a range of from about $1\times10^5$ ohm·meter ($\Omega$·m) to about $3\times10^5$ $\Omega$·m, for example, about $1.8\times10^5$ ohm·meter ($\Omega$·m). The semiconductor substrate can be a silicon wafer. The method may also include the step of rotating the semiconductor substrate at a third rotational frequency as a third agent is introduced to the top surface of the semiconductor substrate, wherein the first rotational frequency is greater than the third rotational frequency and the third rotational frequency is greater than the second rotational frequency. The first agent, the second agent, and the third agent can each be deionized water. The third rotational frequency may be in a range of from about 300 revolutions per minute (rpm) to about 600 rpm. In some embodiments, during the immersing step, the semiconductor substrate is immersed in the second agent for a duration in a range of from about 5 seconds to about 50 seconds, for example, from about 8 seconds to about 10 seconds.

Other embodiments of cleaning a semiconductor substrate include steps of: applying a first agent to a top surface of the semiconductor substrate as the semiconductor substrate is rotated at a first rotational frequency; immersing the semiconductor substrate in a second agent while the semiconductor substrate is stationary; and rotating the semiconductor substrate at a third rotational frequency while a third agent is introduced to the top surface of the semiconductor substrate. The first, the second and the third agents have the same composition, and are a liquid cleaning medium (or agent). The first rotational frequency is greater than the third rotational frequency. The agent can be deionized water. Alternatively, the liquid cleaning agent can be an agent with a resistivity in a suitable range, for example, in a range of from about $1\times10^5$ ohm·meter ($\Omega$·m) to about $3\times10^5$ $\Omega$·m, for example, (e.g., $1.8\times10^5$ $\Omega$·m). The third rotational frequency is in a range of from about 300 revolutions per minute to about 600 revolutions per minute in some embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning a semiconductor substrate, consisting of sequential steps of:
  applying a first agent onto a top surface of the semiconductor substrate while rotating the semiconductor substrate at a first rotational frequency;
  immersing the semiconductor substrate in a second agent while the semiconductor substrate is stationary during the immersing step; and
  rotating the semiconductor substrate at a third rotational frequency while introducing a third agent onto the top surface of the semiconductor substrate;
  wherein the first rotational frequency is greater than the third rotational frequency and the third rotational frequency is greater than zero, and
  wherein each of the first agent, the second agent, and the third agent consists of deionized water.

2. The method of claim 1, wherein the second agent has a resistivity in a range of from about $1\times10^5$ ohm·meter ($\Omega$·m) to about $3\times10^5$ $\Omega$·m.

3. The method of claim 1, wherein the third rotational frequency is in a range of from about 300 revolutions per minute to about 600 revolutions per minute.

4. The method of claim 1, wherein during the immersing step the semiconductor substrate is immersed in the second agent for a duration in a range of from about 8 seconds to about 10 seconds.

5. A method of cleaning a semiconductor substrate, consisting of sequential steps of:
  applying a first agent to a top surface of the semiconductor substrate while rotating the semiconductor substrate at a first rotational frequency; and
  immersing the semiconductor substrate in a second agent while the semiconductor substrate is stationary during the immersing step;
  wherein each of the first agent and the second agent consists of deionized water,
  wherein the second agent has a resistivity in a range of about $1\times10^5$ $\Omega$·m to about $3\times10^5$ $\Omega$·m, and
  wherein each of the steps is performed at a temperature in a range of from about 23 degrees Celsius to about 25 degrees Celsius.

6. The method of claim 5, wherein the semiconductor substrate is a silicon wafer.

7. The method of claim 5, further comprising a step of rotating the semiconductor substrate at a third rotational frequency as a third agent is introduced to the top surface of the semiconductor substrate, wherein the first rotational frequency is greater than the third rotational frequency and the third rotational frequency is greater than the second rotational frequency.

8. The method of claim 7, wherein the third agent consists of deionized water.

9. The method of claim 7, wherein the third rotational frequency is in a range of from about 300 revolutions per minute to about 600 revolutions per minute.

10. The method of claim 7, wherein during the immersing step, the semiconductor substrate is immersed in the second agent for a duration in a range of from about 8 seconds to about 10 seconds.

11. A method of cleaning a semiconductor substrate consisting of sequential steps of:
  applying a first agent to a top surface of the semiconductor substrate while rotating the semiconductor substrate at a first rotational frequency;
  immersing the semiconductor substrate in a second agent while the semiconductor substrate is stationary; and
  rotating the semiconductor substrate at a third rotational frequency while introducing a third agent to the top surface of the semiconductor substrate;

wherein the first agent, the second agent and the third agent are a same liquid cleaning agent, the first rotational frequency is greater than the third rotational frequency, and the third rotational frequency is greater than zero, wherein each of the first agent, the second agent, and the third agent consists of deionized water, and wherein each of the steps is performed at a temperature in a range of from about 23 degrees Celsius to about 25 degrees Celsius.

12. The method of claim 11, wherein the same liquid cleaning agent has a resistivity of about $1.8 \times 10^5$ ohm·meter ($\Omega$·m).

13. The method of claim 11, wherein the third rotational frequency is in a range of from about 300 revolutions per minute to about 600 revolutions per minute.

14. The method of claim 11, wherein during the immersing step, the semiconductor substrate is immersed in the second agent for a duration in a range of from about 8 seconds to about 10 seconds.

15. The method of claim 11, wherein the first rotational frequency is in a range of from about 1,000 to 2,000 rpm.

* * * * *